US012751215B2

(12) United States Patent
Oreg et al.

(10) Patent No.: US 12,751,215 B2
(45) Date of Patent: Sep. 29, 2026

(54) QUANTUM COMPUTING DEVICE

(71) Applicants: YEDA RESEARCH AND DEVELOPMENT CO. LTD., Rehovot (IL); UNIVERSITY OF COPENHAGEN, Copenhagen K (DK)

(72) Inventors: Yuval Oreg, Rehovot (IL); Gal Shavit, Rehovot (IL); Omri Lesser, Rehovot (IL); Erez Berg, Rehovot (IL); Adiel Stern, Rehovot (IL); Karsten Flensberg, Copenhagen (DK)

(73) Assignees: YEDA RESEARCH AND DEVELOPMENT CO. LTD., Rehovot (IL); UNIVERSITY OF COPENHAGEN, Copenhagen (DK)

( * ) Notice: Subject to any disclaimer, the term of this patent is extended or adjusted under 35 U.S.C. 154(b) by 1074 days.

(21) Appl. No.: 17/781,389

(22) PCT Filed: Dec. 2, 2020

(86) PCT No.: PCT/IL2020/051240
§ 371 (c)(1),
(2) Date: Jun. 1, 2022

(87) PCT Pub. No.: WO2021/111438
PCT Pub. Date: Jun. 10, 2021

(65) Prior Publication Data
US 2023/0004850 A1 Jan. 5, 2023

(30) Foreign Application Priority Data
Dec. 2, 2019 (IL) .......................................... 271113

(51) Int. Cl.
*H10N 60/10* (2023.01)
*G06N 10/40* (2022.01)
(Continued)

(52) U.S. Cl.
CPC ........... *H10N 60/128* (2023.02); *G06N 10/40* (2022.01); *H10N 60/855* (2023.02); *B82Y 10/00* (2013.01)

(58) Field of Classification Search
CPC ............................. H10N 60/128; G06N 10/40
See application file for complete search history.

(56) References Cited

U.S. PATENT DOCUMENTS

2019/0099101 A1* 4/2019 Ford .................... A61B 5/0042
2019/0288367 A1* 9/2019 Schuster .................. H01P 1/30
(Continued)

OTHER PUBLICATIONS

Cleuziou et al. Carbon nanotube superconducting quantum interference device. Nature Nanotechnology vol. 1 Oct. 2006, pp. 53-59. (Year: 2006).*
(Continued)

*Primary Examiner* — Paul A Wartalowicz
(74) *Attorney, Agent, or Firm* — Mark S. Cohen; PEARL COHEN LLP

(57) ABSTRACT

Provided is a quantum computing device comprising a carbon nanotube, a superconducting substrate in quantum proximity to the nanotube and being in a superconducting state having a pairing correlation matrix with a substantial spin-triplet component in a direction perpendicular to the nanotube, and a magnet arranged to provide a longitudinal magnetic field along a longitudinal axis of the nanotube. Further provided is a quantum computing device comprising at least three substrates made of a superconductor material and each in a superconducting state, and a non-superconducting structure made of a material in which the electrons' closed trajectories experience strong spin-orbit coupling interactions and being in quantum proximity to the substrates. The sum of the phase differences between the order parameters of all of the substrates is at least π.

20 Claims, 2 Drawing Sheets

(51) Int. Cl.
*H10N 60/85* (2023.01)
*B82Y 10/00* (2011.01)

(56) References Cited

U.S. PATENT DOCUMENTS

| | | | | |
|---|---|---|---|---|
| 2020/0018803 | A1* | 1/2020 | Lemay | A61B 5/0522 |
| 2021/0130944 | A1* | 5/2021 | Holmes | H01L 21/0245 |
| 2021/0156795 | A1* | 5/2021 | Wan | G01N 21/359 |

OTHER PUBLICATIONS

Ando T. "Spin-orbit interaction in carbon nanotubes" Journal of the Physical Society of Japan. Jun. 2000;69(6):1757-63.
Charlier et al. "Electronic and transport properties of nanotubes" Reviews of modern physics. May 16, 2007;79(2):677.
Das et al. "Zero-bias peaks and splitting in an Al-InAs nanowire topological superconductor as a signature of Majorana fermions" Nature Physics. Dec. 2012;8(12):887-95.
De La Barrera et al. "Tuning Ising superconductivity with layer and spin-orbit coupling in two-dimensional transition-metal dichalcogenides" Nature communications. Apr. 12, 2018;9(1):1-8.
Deng et al. "Anomalous zero-blas conductance peak in a Nb—InSb nanowire—Nb hybrid device" Nano letters. Dec. 12, 2012;12(12):6414-9.
Deng et al. "Majorana bound state in a coupled quantum-dot hybrid-nanowire system" Science. Dec. 23, 2016;354(6319):1557-62.
Dresselhaus et al. "Physics of carbon nanotubes" Carbon. Jan. 1, 1995;33(7):883-91.
Dvir et al. "Spectroscopy of bulk and few-layer superconducting NbSe2 with van der Waals tunnel junctions" Nature communications. Feb. 9, 2018;9(1):1-6.
Efroni et al. "Topological transitions and fractional charges induced by strain and a magnetic field in carbon nanotubes" Physical Review Letters. Oct. 5, 2017;119(14):147704.
Ghosh et al. "Non-Abelian topological order in noncentrosymmetric superconductors with broken time-reversal symmetry" Physical Review B. Nov. 16, 2010:82(18):184525.
Han et al. "Investigation of the two-gap superconductivity in a few-layer NbSe 2-graphene heterojunction" Physical Review B. Feb. 16, 2018;97(6):060505.
Hell et al. "Two-dimensional platform for networks of Majorana bound states" Physical review letters. Mar. 10, 2017;118(10):107701.
Huertas-Hernando et al. "Spin-orbit coupling in curved graphene, fullerenes, nanotubes, and nanotube caps" Physical Review B. Oct. 24, 2006;74(15):155426.
Iijima S. "Helical microtubules of graphitic carbon" nature. Nov. 1991;354(6348):56-8.
International Search Report for PCT Application No. PCT/IL2020/051240 dated Mar. 16, 2021.
Izumida et al. "Spin-orbit interaction in single wall carbon nanotubes: Symmetry adapted tight-binding calculation and effective model analysis" Journal of the Physical Society of Japan. Jun. 25, 2009;78(7):074707.
Jeong et al. "Curvature-enhanced spin-orbit coupling in a carbon nanotube" Physical Review B. Aug. 7, 2009;80(7):075409.
Karzig et al. "Scalable designs for quasiparticle-poisoning-protected topological quantum computation with Majorana zero modes" Physical Review B. Jun. 21, 2017;95(23):235305.
Kim et al. "Strong proximity Josephson coupling in vertically stacked NbSe2—graphene—NbSe2 van der Waals junctions" Nano Letters. Oct. 11, 2017;17(10):6125-30.
Kitaev AY. "Fault-tolerant quantum computation by anyons" Annals of Physics. Jan. 1, 2003;303(1):2-30.
Kitaev AY. "Unpaired Majorana fermions in quantum wires" Physics-uspekhi. Oct. 1, 2001;44(10S):131.
Klinovaja et al. "Electric-field-induced Majorana fermions in arm-chair carbon nanotubes" Physical review letters. May 8, 2012;108(19):196804.
Kuemmeth et al. "Coupling of spin and orbital motion of electrons in carbon nanotubes" Nature. Mar. 2008;452(7186):448-52.
Laird et al. "Quantum transport in carbon nanotubes" Reviews of Modern Physics. Jul. 28, 2015;87(3):703.
Lesser et al. "Topological superconductivity in carbon nanotubes with a small magnetic flux" arXiv preprint arXiv:2003.01730. Mar. 3, 2020.
Lu et al. "Evidence for two-dimensional Ising superconductivity in gated MoS2" Science. Dec. 11, 2015;350(6266):1353-7.
Lutchyn et al. "Majorana zero modes in superconductor-semiconductor heterostructures" Nature Reviews Materials. May 2018;3(5):52-68.
Lutchyn et al. "Search for Majorana fermions in multiband semi-conducting nanowires" Physical review letters. Mar. 21, 2011;106(12):127001.
Lutchyn et al. "Majorana fermions and a topological phase transition in semiconductor-superconductor heterostructures" Physical review letters. Aug. 13, 2010;105(7):077001.
Marganska et al. "Majorana quasiparticles in semiconducting carbon nanotubes" Physical Review B. Feb. 22, 2018;97(7):075141.
Mourik et al. "Signatures of Majorana fermions in hybrid superconductor-semiconductor nanowire devices" Science. May 25, 2012;336(6084):1003-7.
Nayak et al. "Non-Abelian anyons and topological quantum computation" Reviews of Modern Physics. Sep. 12, 2008;80(3):1083.
Oreg et al. "Helical liquids and Majorana bound states in quantum wires" Physical review letters. Oct. 20, 2010;105(17):177002.
Pientka et al. "Topological superconductivity in a planar Josephson junction" Physical Review X. May 30, 2017;7(2):021032.
Read et al. "Paired states of fermions in two dimensions with breaking of parity and time-reversal symmetries and the fractional quantum Hall effect" Physical Review B. Apr. 15, 2000;61(15):10267.
Saito et al. "Superconductivity protected by spin-valley locking in ion-gated MoS2" Nature Physics. Feb. 2016; 12(2):144-9.
Sarma et al. "Majorana zero modes and topological quantum computation" npj Quantum Information. Oct. 27, 2015;1(1):1-3.
Sau et al. "Topological superconducting state and Majorana fermions in carbon nanotubes" Physical Review B. Aug. 9, 2013;88(5):054503.
Sohn et al. "An unusual continuous paramagnetic-limited superconducting phase transition in 2D NbSe 2" Nature materials. Jun. 2018; 17(6):504-8.
Tomanek et al. "First-principles calculation of highly asymmetric structure in scanning-tunneling-microscopy images of graphite" Physical Review B. May 15, 1988;37(14):8327.
Xi et al. "Ising pairing in superconducting NbSe2 atomic layers" Nature Physics. Feb. 2016;12(2):139-43.
Xiao et al. "Coupled spin and valley physics in monolayers of MoS 2 and other group-VI dichalcogenides" Physical review letters. May 7, 2012;108(19):196802.
Yarimizu et al. "Electron transport in a bilayer graphene/layered superconductor NbSe2 junction: effect of work function difference" In Journal of Physics: Conference Series Mar. 1, 2018 (vol. 969, No. 1, p. 012147). IOP Publishing.
Zhu et al. "Giant spin-orbit-induced spin splitting in two-dimensional transition-metal dichalcogenide semiconductors" Physical Review B. Oct. 14, 2011;84(15):153402.
Stern, A., et al. (2019). Fractional Josephson vortices and braiding of Majorana zero modes in planar superconductor-semiconductor heterostructures. Physical review letters, 122(10), 107701.

* cited by examiner

QUANTUM COMPUTING DEVICE

CROSS-REFERENCE TO RELATED APPLICATIONS

This application is a National Phase Application of PCT International Application No. PCT/IL2020/051240, International Filing Date Dec. 2, 2020, claiming the benefit of Israel Patent Application No. 271113, filed Date Dec. 2, 2019, which is incorporated herein by reference.

TECHNOLOGICAL FIELD

The presently disclosed subject matter relates to the field of quantum computing devices, and, in particular, to devices for storing, manipulating, and interacting with qubits.

BACKGROUND

Low-dimensional topological superconductors are unique states of matter, supporting Majorana fermion quasi-particles at the edges of the topological systems. These zero-energy edge modes are their own anti-particles and possess non-Abelian exchange statistics, and thus provide an attractive platform for implementing quantum computing devices that support qubit operations. Majorana zero-modes were first predicated and observed at the ends of one-dimensional (1D) semiconducting nanowires with induced Zeeman spin splitting.

Alternatively, 1D topological superconductivity may also be achieved with carbon nanotubes (CNTs) instead of nanowires. Carbon nanotubes are small diameter cylinder-like allotropes of graphene (having diameter d of the order of 1 nm), with exceptional electronic band structures and transport properties. As opposed to nanowires, carbon nanotubes have a true 1D topology because d is extremely small. Moreover, since the nanotubes are constructed solely of carbon atoms, they have highly reproducible and uniform quantum properties.

These characteristics have made carbon nanotubes a preferred platform for 1D Majorana fermions. FIG. 1 conceptually illustrates a configuration for a typical prior art nanotube device 100, which is based on the same arrangement originally used to realize Majorana fermion quasi-particles in semiconducting nanowires—namely, an inert supporting structure 101, on which is mounted a thin s-wave superconductor 102, proximate to which is located a carbon nanotube 103. A magnet 120 provides a transverse Zeeman magnetic field 121 (Bx). Reference axes 10 indicate that the longitudinal symmetry axis of nanotube 103 is in the z-direction, whereas the magnetic flux of transverse Zeeman magnetic field 121 (Bx) is in the x-direction. In order to attain proper Zeeman splitting, magnetic field 121 needs to be very strong, of the order 10 T, because of the low electron g-factor of carbon nanotube 103. The high strength of Zeeman magnetic field 121 poses practical challenges: first of all, high magnetic fields are not easily produced; secondly, a strong magnetic field tends to critically suppress superconductivity in substrate 102.

SUMMARY

The presently disclosed subject matter provides a quantum computing device having topological Majorana zero-modes without the need for Zeeman splitting, thereby obviating the strong transverse magnetic field necessary to attain Zeeman splitting. Instead of Zeeman splitting, as taught and practiced by the prior art, embodiments of the presently disclosed subject matter rely on a spin-orbital coupling effect and an induced longitudinal magnetic flux along the central axis of the carbon nanotube, as described below and as illustrated in FIG. 2. The longitudinal magnetic field provided by embodiments of the presently disclosed subject matter is much weaker than the prior art transverse field required for Zeeman splitting, typically about an order of magnitude smaller (of the order 1 T), making it far easier to generate and far less disruptive to substrate superconductivity.

Therefore, according to one aspect of the presently disclosed subject matter, there is provided a quantum computing device comprising: (a) a carbon nanotube, wherein the carbon nanotube has a central cylindrical axis about which the carbon nanotube is substantially symmetrical under continuous rotation; (b) a superconducting substrate in quantum proximity to the carbon nanotube, wherein the superconducting substrate is in a superconducting state under suitable physical conditions, and wherein the superconducting state has a pairing correlation matrix with a substantial spin-triplet component in a direction perpendicular to the carbon nanotube; and (c) a magnet arranged to provide a longitudinal magnetic field substantially along the central cylindrical axis of the carbon nanotube.

In particular, there may be provided a quantum computing device comprising:

- a carbon nanotube, wherein the carbon nanotube has a central cylindrical axis about which the carbon nanotube is substantially symmetrical under continuous rotation;
- a superconducting substrate in quantum proximity to the carbon nanotube, wherein the superconducting substrate is in a superconducting state under suitable physical conditions, and wherein the superconducting state has a pairing correlation matrix with a substantial spin-triplet component in a direction perpendicular to the carbon nanotube; and
- a magnet arranged to provide a longitudinal magnetic field substantially along the central cylindrical axis of the carbon nanotube.

The quantum computing device may further comprise an external gate in quantum proximity to the carbon nanotube, and an adjustable voltage source electrically connected to the external gate.

The superconducting substrate may be a monolayer.

The superconducting substrate may comprise a transition-metal dichalcogenide.

The transition-metal dichalcogenide may be selected from a group consisting of niobium diselenide and molybdenum disulfide.

The superconducting substrate may comprise a heavy element. The heavy element may be selected from a group consisting of lead and gold.

The voltage source may be operative to tune the chemical potential of the carbon nanotube such that it exhibits a half-metallic state.

According to another aspect of the presently disclosed subject matter, there is provided a quantum computing device comprising:

- at least three substrates, each made of a superconductor material and each being in a superconducting state; and
- a non-superconducting structure made of a material in which the electrons' closed trajectories experience strong spin-orbit coupling interactions, the non-superconducting structure being in quantum proximity to the substrates;

wherein the sum of the phase differences between the order parameters of all of the substrates is at least $\pi$.

The quantum computing device may further comprise two or more loops, each being made of a superconductor material and spanning between a pair of the substrates, each of the substrates being connected to another one of the substrates by at least one of the loops, the connected substrates having a phase difference between respective order parameters thereof; and at least one magnetic source configured to produce a magnetic field through the loops.

Each of the loops may define an inscribed circle having a radius exceeding about 10 μm, about 20 μm, or about 30 μm.

The strength of the magnetic field may be less than about 10 μT, or than about 1 μT, for example depending on the radius of the loops.

The substrates may be in contact with a superconductor material having an electric current passing therethrough. The superconductor material (i.e., that in contact with the substrates) may be different from the material of the substrates.

Each of the substrates may be made of a superconductor material selected from a group including aluminum, niobium, lead, and a superconducting transition metal dichalcogenide.

The substrates may be made of the same material.

The non-superconducting structure may be made from a material selected from a group including mercury telluride, indium arsenide, indium antimonide, niobium diselenide, lead, and a superconducting transition metal dichalcogenide.

The non-superconducting structure may comprise an elongate nanostructure. The elongate nanostructure may be made of carbon. The elongate nanostructure may be a nanotube, or it may be a nanofiber.

The substrates may be disposed on the same side of the non-superconducting structure.

At least some of the substrates may be separated by an inert supporting structure.

The quantum computing device may comprise more than three of the substrates.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which.

Figure 1:
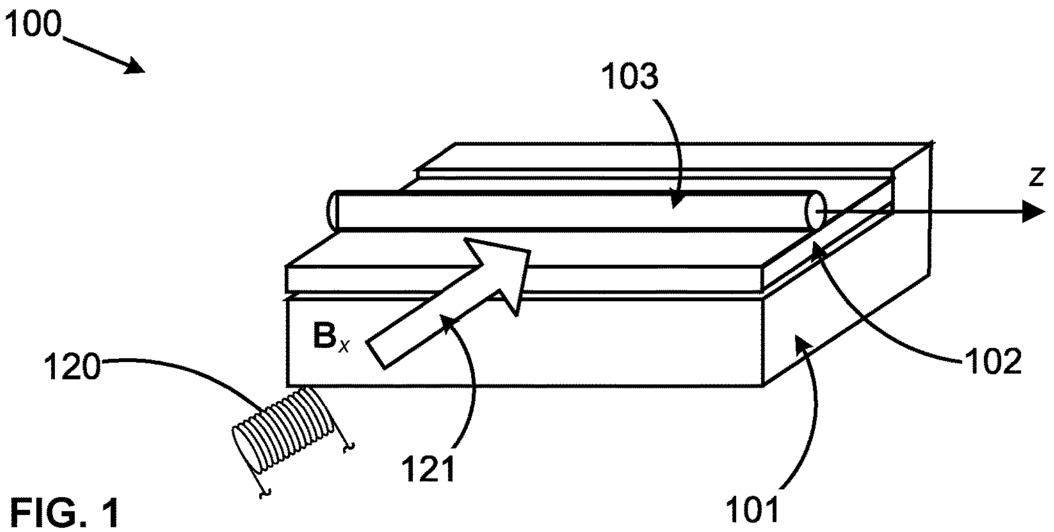
FIG. 1 (PRIOR ART)
FIG. 1 is a schematic illustration of a carbon nanotube and its supporting structures in a prior art quantum computing device configuration, featuring a magnet arranged to provide a transverse magnetic field perpendicular to the carbon nanotube's longitudinal axis to induce Zeeman splitting.

For simplicity and clarity of illustration, elements shown in the figures are not necessarily drawn to scale, and the dimensions of some elements may be exaggerated relative to other elements. In addition, reference numerals may be repeated among the figures to indicate corresponding or analogous elements.

DETAILED DESCRIPTION

Figure 2:
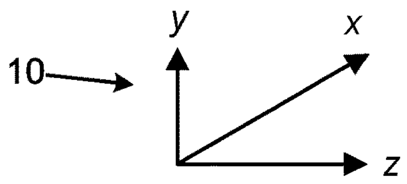
FIG. 2 is a schematic illustration of carbon nanotube and its supporting structures in a quantum computing configuration according to an embodiment of the presently disclosed subject matter, featuring a magnet arranged to provide a longitudinal magnetic field parallel to the carbon nanotube's longitudinal axis.
Figure 2:
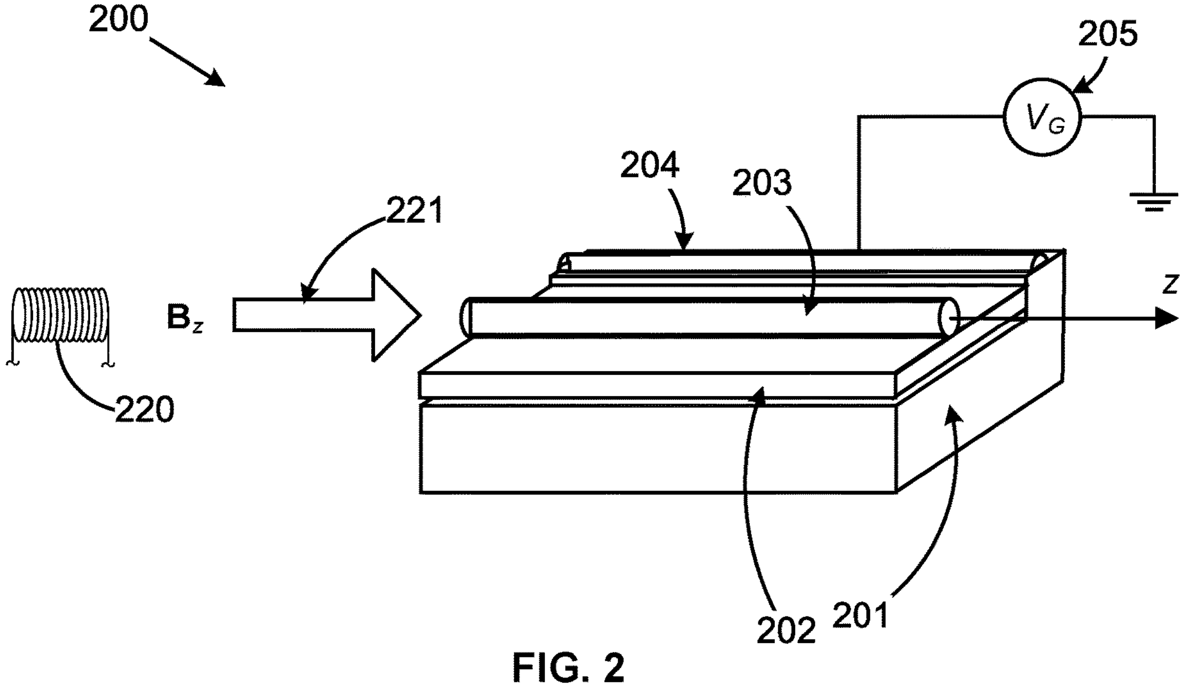

FIG. 2 conceptually illustrates a quantum computing device 200 featuring a carbon nanotube 203 and its auxiliary elements according to an embodiment of the presently disclosed subject matter. Device 200 is mounted on an inert supporting structure 201, on which is mounted a thin superconducting substrate 202, with which carbon nanotube 203 is in quantum proximity. A magnet 220 provides a longitudinal magnetic field 221 along the direction of the central cylindrical axis of carbon nanotube 203. Reference axes 10 indicate that the magnetic flux of longitudinal magnetic field 221 ($B_Z$) is in the z-direction parallel to the central cylindrical axis of nanotube 203 in the z-direction. Also provided is a gate 204 in quantum proximity to carbon nanotube 203, wherein gate 204 is electrically connected to an adjustable voltage source $V_G$ 205.

The term "longitudinal" in the context of carbon nanotubes, herein denotes the direction of the central cylindrical axis of the nanotube, extending substantially along this direction, or substantially being parallel thereto. In contrast, the term "transverse" in the context of carbon nanotubes herein denotes a direction substantially perpendicular to the central cylindrical axis. The term "central cylindrical axis" herein denotes the axis about which the nanotube is substantially symmetrical under continuous rotation; that is, the central cylindrical axis of a nanotube is the nanotube's "symmetry axis."

The term "quantum proximity" herein denotes a close relative positioning of two structures, such that a physical property or state of one structure is capable of detectably affecting a quantum-mechanical property or state of the other structure.

The term "superconducting substrate" in the context of being a component of a device, herein denotes a surface made of a material which is in a superconducting state under suitable physical conditions, and which, when the device is in a functionally operational mode, is rendered superconducting by being put in the suitable physical conditions.

When longitudinal magnetic field 221 combines with the electronic spin-orbital coupling in carbon nanotube 203 under the condition that the electronic rotational symmetry of carbon nanotube 203 is broken (such as by voltage $V_G$ 205 on external gate 204), carbon nanotube 203 exhibits a half-metallic state. Then, when carbon nanotube 203 is in quantum proximity to a superconducting substrate having a significant spin-triplet component in its Cooper pair wavefunction (such as superconducting substrate 202), a p-wave topological gap opens in carbon nanotube 203, thereby hosting Majorana fermion quasi-particles at its ends.

In various embodiments of the presently disclosed subject matter, a superconducting substrate 202 exhibits strong spin-orbital coupling that is conducive to pairing of electrons that are spin-polarized in the plane of substrate 202. In these embodiments, superconducting substrate 202 has a pairing correlation matrix with a substantial spin-triplet component in a direction perpendicular to carbon nanotube 203. In related embodiments, substrate 202 comprises a transition-metal dichalcogenide (TMD). TMDs exhibit strong Ising spin-orbit coupling, with a triplet component pointing in the out-of-plane direction. This is necessarily perpendicular to nanotube 203, whose longitudinal axis is parallel to the surface plane of superconducting substrate 202. Other embodiments comprise heavy elements, such as lead (Pb) and gold (Au), in superconducting substrate 202. According to a related embodiment, a thin film is employed for superconducting substrate 202. In another related embodiment, the thin film is a monolayer. In other related embodiments, TMDs comprise niobium diselenide ($NbSe_2$) and molybdenum disulfide ($MoS_2$).

In a further embodiment of the presently disclosed subject matter, voltage source 205 is adjusted to tune the chemical potential of carbon nanotube 203 to exhibit a half-metallic state, thereby opening up a topological gap in carbon nanotube 203, and hosting Majorana fermion quasi-particles at the ends of carbon nanotube 203.

Figure 3A:
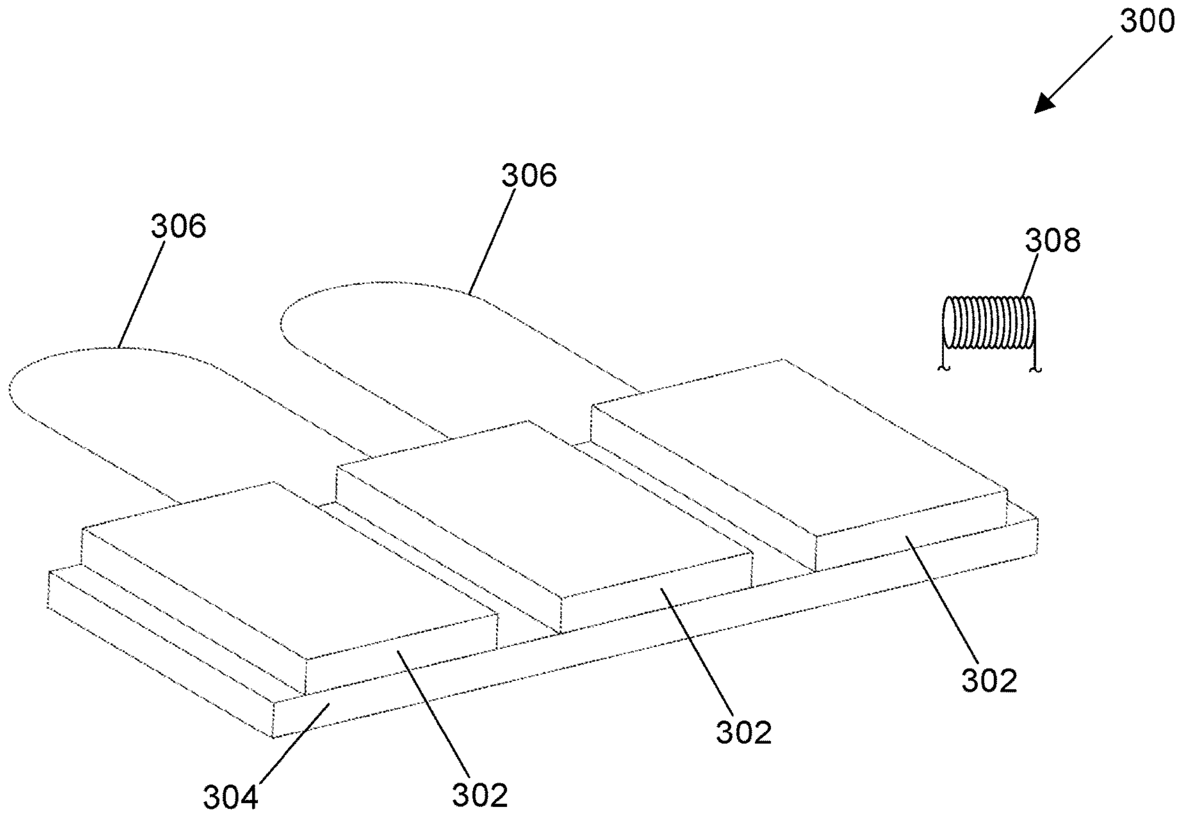
FIGS. 3A and 3B are schematic illustrations of examples of components of quantum computing devices according to the presently disclosed subject matter.

As illustrated in FIG. 3A, another example of a quantum computing device is provided, which is generally indicated at 300. The device 300 comprises three or more substrates 302 made of a superconducting material and being in a superconducting state. The substrates 302 are disposed on a non-superconducting structure 304 such that they are in quantum proximity therewith. The non-superconducting structure is made of a material which is characterized, inter alia, by electrons having closed trajectories which experience high spin-orbit coupling. According to some examples, it may comprise a non-superconducting metal and/or a conventional semiconductor. The sum of phase differences between the order parameters of the substrates 302 is at least π. Owing to its strong spin-orbit coupling, the phase difference of the substrates 302 gives rise to Majorana fermion quasi-particles at opposite sides of the non-superconducting structure 304. A spin-orbit coupling interaction may be considered to be "strong" if, e.g., it is characterized by a spin-orbit parameter having a value which is larger than that at which the device operates.

The substrates 302 may be made from any suitable superconducting material. Non-limiting examples include aluminum, niobium, lead, and a superconducting transition metal dichalcogenide. All of the substrates 302 may be made from the same material, or two or more may be made from different materials.

The non-superconducting structure 304 may be made from any suitable material. Non-limiting examples include mercury telluride, indium arsenide, indium antimonide, niobium diselenide, lead, and a superconducting transition metal dichalcogenide. According to some examples the material of the non-superconducting structure is different than that of the substrates 302. According to other examples the material of the non-superconducting structure is the same as that of the substrates 302.

According to some examples, loops 306 of superconducting material are provided to facilitate the required phase difference in the substrates 302. Each of the loops 306 spans between two of the substrates 302, such that each of the substrates is in contact with at least one loop 306. A magnetic source, indicated schematically at 308 is provided to produce a magnetic field through the loops 306. The loops 306 may have a large diameter, for example about 30 μm, such that the magnetic flux required to induce the necessary phase difference in the substrates 302 is relatively low, for example about 1 μT.

Figure 3B:
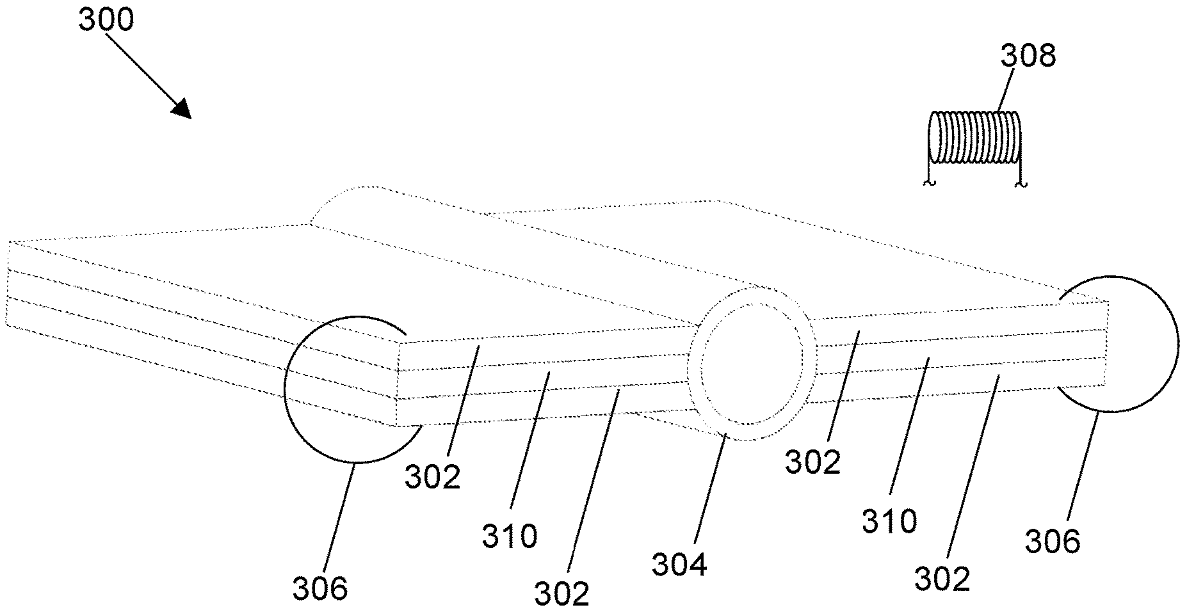

According to other examples, for example as illustrated in FIG. 3B, the non-superconducting structure 304 may comprise an elongate nanostructure. According to some examples, the elongate nanostructure may be a carbon nanotube as illustrated. According to other examples (not illustrated), the elongate nanostructure may be a carbon nanofiber. The substrates 302 may be arranged in two or more parallel layers, with an inert supporting structure 310 disposed therebetween. Similar to the example described above with reference to and as illustrated in FIG. 3A, loops 306 of superconducting material may be provided to facilitate the required phase difference in the substrates 302, with a magnetic source (not illustrated in FIG. 3A) provided to produce the small magnetic field necessary to induce the phase difference. When order parameters of the substrates 302 are produced having phase differences whose sum is at least π, Majorana fermion quasi-particles arise at opposite longitudinal ends of the nanostructure.

It will be appreciated that the examples described above with reference to and as illustrated in FIGS. 3A and 3B are by way of example, and a computing device may be provided according to the presently disclosed subject matter in which a phase difference in the order parameters of the substrates 302 is produced by any other suitable means. For example, according to some modifications, the computing devices 300 may be provided as described above with reference to and as illustrated in FIGS. 3A and 3B, but without the loops 306 and magnetic source 308. In order to produce order parameters which have the required phase difference, the substrates may be connected by a piece of superconductor materiel, e.g., a fiber, through which an electrical current is passed, for example as is well known in the art.

It will be further appreciated that while the examples described above with reference to and as illustrated in FIGS. 3A and 3B comprise three substrates 302, a computing device 300 may be provided according to the presently disclosed subject matter with more than three substrates, for example four, five, or six substrates, as long as the sum of the phase differences between the order parameters thereof is at least π.

Those skilled in the art to which this invention pertains will readily appreciate that numerous changes, variations, and modifications can be made without departing from the scope of the presently disclosed subject matter, mutatis mutandis.

The invention claimed is:

1. A quantum computing device comprising:

at least three substrates, each made of a superconductor material and each being in a superconducting state; and a non-superconducting structure made of a material in which the electrons' closed trajectories experience strong spin-orbit coupling interactions, said non-superconducting structure being in quantum proximity to said substrates;

wherein the sum of the phase differences between the order parameters of all of the substrates is at least π;

having a topological phase not induced by Zeeman splitting and does not require a Zeeman energy comparable to the superconducting gap.

2. The quantum computing device according to claim 1, further comprising: two or more loops, each being made of a superconductor material and spanning between a pair of said substrates, each of the substrates being connected to another one of said substrates by at least one of said loops, said connected substrates having a phase difference between respective order parameters thereof; and at least one magnetic source configured to produce a non-Zeeman magnetic field through said loops, wherein the non-Zeeman magnetic field is much weaker than a magnetic field required for Zeeman splitting.

3. The quantum computing device according to claim 2, wherein each of said loops defines an inscribed circle having a radius exceeding about 10 μm.

4. The quantum computing device according to claim 3, wherein each of said loops defines an inscribed circle having a radius exceeding about 20 μm.

5. The quantum computing device according to claim 4, wherein each of said loops defines an inscribed circle having a radius exceeding about 30 μm.

6. The quantum computing device according to claim 2, wherein the strength of the non-Zeeman magnetic field is no greater than about 10 μT.

7. The quantum computing device according to claim 6, wherein the strength of the non-Zeeman magnetic field is no greater than about 1 μT.

8. The quantum computing device according to claim 1, said substrates being in contact with a superconductor material having an electric current passing therethrough.

9. The quantum computing device according to claim 8, wherein the superconductor material is different from the material of the substrates.

10. The quantum computing device according to claim 1, wherein the substrates are made of the same material.

11. The quantum computing device according to claim 1, wherein said non-superconducting structure comprises an elongate nanostructure.

12. The quantum computing device according to claim 11, wherein said elongate nanostructure is made of carbon.

13. The quantum computing device according to claim 1, wherein said substrates are disposed on the same side of the non-superconducting structure.

14. The quantum computing device according to claim 1, wherein at least some of said substrates are separated by an inert supporting structure.

15. A quantum computing device comprising:

a carbon nanotube, wherein the carbon nanotube has a central cylindrical axis about which the carbon nanotube is substantially symmetrical under continuous rotation;

a superconducting substrate in quantum proximity to the carbon nanotube, wherein the superconducting substrate is in a superconducting state under suitable physical conditions, and wherein the superconducting state has a pairing correlation matrix with a substantial spin-triplet component in a direction perpendicular to the carbon nanotube; and a magnet arranged to provide a longitudinal magnetic field substantially along the central cylindrical axis of the carbon nanotube.

16. The quantum computing device according to claim 15, further comprising:

an external gate in quantum proximity to the carbon nanotube; and an adjustable voltage source electrically connected to the external gate.

17. The quantum computing device according to claim 16, wherein the carbon nanotube has a chemical potential, the voltage source being operative to tune the chemical potential such that the carbon nanotube exhibits a half-metallic state.

18. The quantum computing device according to claim 15, wherein the superconducting substrate is a monolayer.

19. The quantum computing device according to claim 15, wherein the superconducting substrate comprises a transition-metal dichalcogenide.

20. The quantum computing device according to claim 15, wherein the superconducting substrate comprises a heavy element.

* * * * *